United States Patent
Wei et al.

(10) Patent No.: US 11,799,578 B2
(45) Date of Patent: Oct. 24, 2023

(54) TIME SYNCHRONIZATION METHOD AND DEVICE, NETWORK NODE DEVICE

(71) Applicants: Beijing BOE Technology Development Co., Ltd., Beijing (CN); BOE TECHNOLOGY GROUP CO., LTD., Beijing (CN)

(72) Inventors: Xiangye Wei, Beijing (CN); Liming Xiu, Beijing (CN); Yiming Bai, Beijing (CN)

(73) Assignees: Beijing BOE Technology Development Co., Ltd., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 202 days.

(21) Appl. No.: 17/413,367

(22) PCT Filed: Jan. 19, 2020

(86) PCT No.: PCT/CN2020/072979
§ 371 (c)(1),
(2) Date: Jun. 11, 2021

(87) PCT Pub. No.: WO2021/142828
PCT Pub. Date: Jul. 22, 2021

(65) Prior Publication Data
US 2022/0311529 A1    Sep. 29, 2022

(51) Int. Cl.
*H04J 3/06* (2006.01)
*H03L 7/18* (2006.01)

(52) U.S. Cl.
CPC .............. *H04J 3/0658* (2013.01); *H03L 7/18* (2013.01); *H04J 3/0641* (2013.01); *H04J 3/0679* (2013.01)

(58) Field of Classification Search
CPC ...... G06F 1/08; G06F 1/12; G06F 1/14; H04J 3/0641; H04J 3/0658; H04J 3/0679; H04J 3/0682; H04W 56/00
See application file for complete search history.

(56) References Cited

U.S. PATENT DOCUMENTS 9,740,235 B1 * 8/2017 Xiu ........................... G06F 1/12
10,503,534 B1    12/2019 Southgate et al.
(Continued)

FOREIGN PATENT DOCUMENTS

CN    101883420 A    11/2010
CN    102752843 A    10/2012
(Continued)

OTHER PUBLICATIONS

China Patent Office, CN202080000051.8 First Office Action dated Jul. 29, 2022.

*Primary Examiner* — Pao Sinkantarakorn
(74) *Attorney, Agent, or Firm* — HOUTTEMAN LAW LLC

(57) ABSTRACT

This is provided a time synchronization method, including: an adjustment stage including N adjustment cycles, N being an integer greater than 1; in each adjustment cycle, generating a physical clock signal at least according to a pre-acquired frequency control word corresponding to the adjustment cycle, and obtaining logical time at least according to the physical clock signal and a physical time deviation; a clock slope of the physical clock signal generated in each adjustment cycle reaches its corresponding target value, and the target values of the clock slopes of the physical clock signals in the N adjustment cycles gradually approach 1; the physical time deviation is: a time difference between the reference time and the physical time corresponding to the physical clock signal in an Nth adjustment
(Continued)

in each adjustment cycle, generate a physical clock signal at least according to a pre-acquired frequency control word corresponding to the adjustment cycle, and obtain logical time at least according to the physical clock signal and a physical time deviation — S110 cycle at the end of the Nth adjustment cycle. A time synchronization device and a network node device are provided.

20 Claims, 9 Drawing Sheets

(56) References Cited

U.S. PATENT DOCUMENTS

2015/0163000 A1* 6/2015 Aweya .................. H04J 3/0667
 370/503
2016/0315757 A1* 10/2016 Malekpour ......... H04W 56/003

FOREIGN PATENT DOCUMENTS

| CN | 105553598 A | 5/2016 |
| CN | 107300688 A | 10/2017 |
| CN | 107425851 A | 12/2017 |
| CN | 110581743 A | 12/2019 |

* cited by examiner

| in each adjustment cycle, generate a physical clock signal at least according to a pre-acquired frequency control word corresponding to the adjustment cycle, and obtain logical time at least according to the physical clock signal and a physical time deviation | ← S110 |

Fig. 3

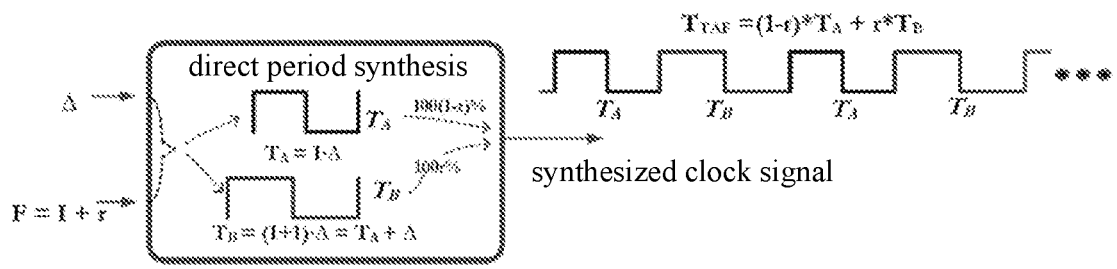

synthesized clock signal

Fig. 4

| determine the target value of the clock slope of the physical clock signal in each adjustment cycle | ← S101 |

↓

| for each adjustment cycle, determine the frequency control word corresponding to the adjustment cycle according to the target value of the clock slope of the physical clock signal in the adjustment cycle and the difference between the reference time corresponding to the beginning of the adjustment cycle and the reference time corresponding to the end of the adjustment cycle | ← S102 |

↓

| determine a time deviation | ← S103 |

↓

| in each adjustment cycle, generate a physical clock signal at least according to a pre-acquired frequency control word corresponding to the adjustment cycle, and obtain logical time at least according to the physical clock signal and the physical time deviation | ← S110 |

Fig. 5

TIME SYNCHRONIZATION METHOD AND DEVICE, NETWORK NODE DEVICE

CROSS-REFERENCE TO RELATED APPLICATION

This is a National Phase Application filed under 35 U.S.C. 371 as a national stage of PCT/CN2020/072979, filed on Jan. 19, 2020, the content of which is hereby incorporated by reference in its entirety.

TECHNICAL FIELD

The present disclosure relates to the technical field of communication networks, in particular to a time synchronization method, a time synchronization device, and network node device.

BACKGROUND

With the development of the Internet of Everything, modern electronic systems have evolved from traditional wired communication to wireless communication. In the architecture design and implementation of a telecommunication network, a computer network or other type of electronic device network, clock synchronization is vital.

SUMMARY

The embodiments of the present disclosure propose a time synchronization method and device, and a network node device, so as to make the logical time of the network node device more accurate, so that the time synchronization of different network node devices is improved.

In a first aspect, an embodiment of the present disclosure provides a time synchronization method, including: an adjustment stage including N adjustment cycles, N being an integer greater than 1;

in each adjustment cycle, generating a physical clock signal at least according to a pre-acquired frequency control word corresponding to the adjustment cycle, and obtaining logical time at least according to the physical clock signal and a physical time deviation;

wherein a clock slope of the physical clock signal generated in each adjustment cycle reaches its corresponding target value, and the target values of the clock slopes of the physical clock signals in the N adjustment cycles gradually approach 1 from a first adjustment cycle to an Nth adjustment cycle; the clock slope is a slope of a relationship curve between physical time generated based on the physical clock signal and reference time; and the physical time deviation is: a time difference between the reference time and the physical time corresponding to the physical clock signal in the Nth adjustment cycle at the end of the Nth adjustment cycle.

In some embodiments, before the adjustment stage, the time synchronization method further includes:
determining the target value of the clock slope of the physical clock signal in each adjustment cycle; and
for each adjustment cycle, determining the frequency control word corresponding to the adjustment cycle according to the target value of the clock slope of the physical clock signal in the adjustment cycle and a difference between the reference time corresponding to the beginning of the adjustment cycle and the reference time corresponding to the end of the adjustment cycle.

In some embodiments, the target value $S_1$ of the clock slope of the physical clock signal in the first adjustment cycle is determined according to the following formula:

$$S_1 = S_0(1-x)$$

where x is a pre-acquired clock frequency deviation coefficient of the physical clock signal in an initial stage; $S_0$ is a value of the clock slope of the physical clock signal generated according to an initial frequency control word in the initial stage, $S_0 = 1+x$; and the target value $S_n$ of the clock slope of the physical clock signal of an nth adjustment cycle is determined according to the following formula:

$$S_n = S_{n-1}(1+x^{2^{n-1}}) = 1-x^{2^n}$$

where $S_{n-1}$ is the target value of the clock slope of the physical clock signal in a (n−1)-th adjustment cycle, n is an integer, and $1 < n \leq N$.

In some embodiments, before the adjustment stage, the time synchronization method further includes: determining the physical time deviation E according to the following formula:

$$E = M \cdot \Delta t \cdot (x - x^2 - x^4 - \ldots - x^{2^n})$$

where $\Delta t$ is a standard clock cycle, and M is the number of clock cycles of the physical clock signal in a single adjustment cycle.

In some embodiments, before the adjustment stage, the time synchronization method further includes: determining the physical time deviation E according to the following formula:

$$E = M \cdot \Delta t \cdot \left( x - \frac{x^2}{1-x^2} \right)$$

where $\Delta t$ is a standard clock cycle, and M is the number of clock cycles of the physical clock signal in a single adjustment cycle.

In some embodiments, obtaining logical time at least according to the physical clock signal and a physical time deviation includes:

determining a first logical clock cycle $T_{l\_1}$ according to the following formula:

$$T_{l\_1} = \Delta t - \frac{E}{N \cdot M}$$

where $\Delta t$ is the standard clock cycle, and E is the physical time deviation; and obtaining the logical time by conversion according to the physical clock signal and the first logical clock cycle.

In some embodiments, the time synchronization method further includes: in a duration stage after the adjustment stage, generating a physical clock signal according to the frequency control word corresponding to the Nth adjustment cycle; and obtaining the logical time by conversion according to the physical clock signal in the duration stage and a second logical clock cycle, wherein the second logical clock cycle is equal to the standard clock cycle.

In some embodiments, generating a physical clock signal at least according to a pre-acquired frequency control word corresponding to the adjustment cycle includes:

generating the physical clock signal according to a reference clock signal and the frequency control word corresponding to the adjustment cycle.

In a second aspect, the embodiments of the present disclosure also provide a time synchronization device, including:

a physical clock signal generation unit configured to generate, in each adjustment cycle of an adjustment stage, a physical clock signal according to at least a pre-acquired frequency control word corresponding to the adjustment cycle; the adjustment stage including N adjustment cycles, N being an integer greater than 1; wherein a clock slope of the physical clock signal generated in each adjustment cycle reaches its corresponding target value, and the target values of the clock slopes of the physical clock signals in the N adjustment cycles gradually approach 1 from a first adjustment cycle to an Nth adjustment cycle; wherein, the clock slope is a slope of a relationship curve between physical time generated based on the physical clock signal and reference time; and a logical time conversion unit configured to convert to obtain logical time at least according to the physical clock signal that is received and a physical time deviation in each adjustment cycle; the physical time deviation is: a time difference between the reference time and the physical time corresponding to the physical clock signal in the Nth adjustment cycle at the end of the Nth adjustment cycle.

In some embodiments, the time synchronization device further includes:

a control word determination unit configured to, before the adjustment stage, determine the target value of the clock slope of the physical clock signal in each adjustment cycle, and determine the frequency control word corresponding to the adjustment cycle according to the target value of the clock slope of the physical clock signal in the adjustment cycle and a difference between the reference time corresponding to the beginning of the adjustment cycle and the reference time corresponding to the end of the adjustment cycle In some embodiments, the target value $S_1$ of the clock slope of the physical clock signal in the first adjustment cycle is determined according to the following formula:

$$S_1 = S_0(1-x)$$

where x is a pre-acquired clock frequency deviation coefficient of the physical clock signal in an initial stage; $S_0$ is a value of the clock slope of the physical clock signal generated according to an initial frequency control word in the initial stage, $S_0 = 1+x$; and the target value $S_n$ of the clock slope of the physical clock signal of an nth adjustment cycle is determined according to the following formula:

$$S_n = S_{n-1}(1+x^{2^{n-1}}) = 1-x^{2^n}$$

where $S_{n-1}$ is the target value of the clock slope of the physical clock signal in a (n−1)-th adjustment cycle, n is an integer, and $1 < n \leq N$.

In some embodiments, the time synchronization device further includes: a first time deviation determination unit configured to determine the physical time deviation E according to the following formula before the adjustment stage:

$$E = M \cdot \Delta t \cdot (x - x^2 - x^4 - \ldots - x^{2^n})$$

where $\Delta t$ is a standard clock cycle, and M is the number of clock cycles of the physical clock signal in a single adjustment cycle.

In some embodiments, the time synchronization device further includes: a second time deviation determination unit configured to determine the physical time deviation E according to the following formula before the adjustment stage:

$$E = M \cdot \Delta t \cdot \left(x - \frac{x^2}{1-x^2}\right)$$

where $\Delta t$ is a standard clock cycle, and M is the number of clock cycles of the physical clock signal in a single adjustment cycle.

In some embodiments, the logical time conversion unit is specifically configured to determine a first logical clock cycle $T_{l\_1}$ according to the following formula in each adjustment cycle, and obtain the logical time by conversion according to the physical clock signal and the first logical clock cycle:

$$T_{l\_1} = \Delta t - \frac{E}{N \cdot M}$$

where $\Delta t$ is the standard clock cycle, and E is the physical time deviation.

In some embodiments, the physical clock signal generation unit is further configured to generate a physical clock signal according to the frequency control word corresponding to the Nth adjustment cycle in a duration stage after the adjustment stage;

the logical time conversion unit is further configured to, in the duration stage, obtain the logical time by conversion according to the physical clock signal in the duration stage and a second logical clock cycle, wherein the second logical clock cycle is equal to the standard clock cycle.

In some embodiments, the physical clock signal generation unit is specifically configured to generate the physical clock signal according to a reference clock signal and the frequency control word corresponding to the adjustment cycle.

In some embodiments, the physical clock generation unit includes a time average frequency direct period synthesizer.

In a third aspect, the embodiments of the present disclosure also provide a network node device, including the time synchronization device as described above.

BRIEF DESCRIPTION OF THE DRAWINGS

The accompanying drawings, which are used to provide a further understanding of the present disclosure and constitute a part of the specification, are used to explain the present disclosure together with the following specific implementations, but do not constitute limitation to the present disclosure. In the accompanying drawings:

FIG. 3 shows a schematic diagram of a time synchronization method according to some embodiments of the present disclosure.

FIG. 4 shows a schematic diagram of the principle of time average frequency according to some embodiments of the present disclosure.

FIG. 5 shows another schematic diagram of a time synchronization method according to some embodiments of the present disclosure.

DETAILED DESCRIPTION

Figure 1:
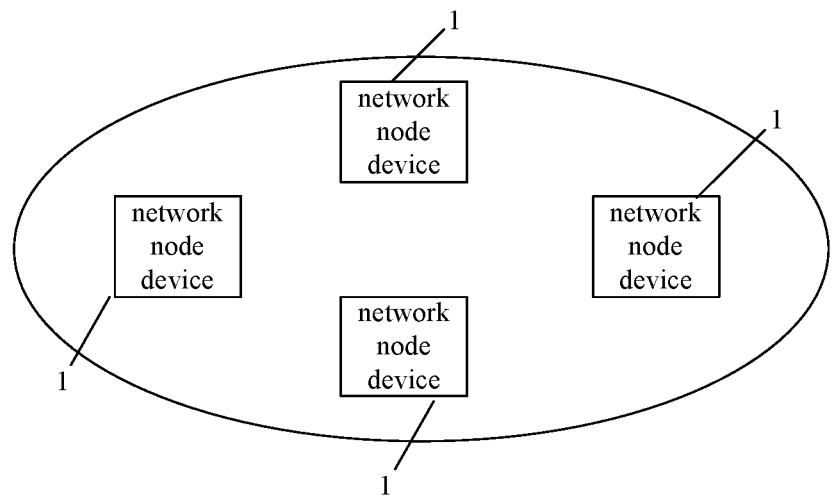
FIG. 1 shows a schematic diagram of a plesiochronous structure.

In order to make the objectives, technical solutions, and advantages of the embodiments of the present disclosure clearer, the technical solutions of the embodiments of the present disclosure will be described clearly and completely in conjunction with the accompanying drawings of the embodiments of the present disclosure. Obviously, the described embodiments are only a part, but not all, of the embodiments of the present disclosure. Based on the described embodiments of the present disclosure, all other embodiments obtained by those of ordinary skill in the art without creative efforts are within the protection scope of the present disclosure.

The terms used here to describe the embodiments of the present disclosure are not intended to limit and/or define the scope of the present disclosure. For example, unless otherwise defined, the technical terms or scientific terms used in the present disclosure shall have the usual meanings understood by those with ordinary skills in the field to which the present disclosure belongs. It should be understood that the words "first", "second" and the like used in the present disclosure do not denote any order, quantity, or importance, but are only used to distinguish different components. Unless otherwise indicated in the context, the words "a", "an", "the" and the like in singular form do not mean a quantitative limitation, but mean that there is at least one.

In the past few decades, the network architecture has evolved from a synchronous time division multiplexing (TDM) mode to an asynchronous packet switching mode. In a TDM system, there is a physical link between different network node devices to realize frequency transmission. In an asynchronous packet switching system, the physical link for frequency transmission no longer exists, and all data and time information are exchanged through packets, which increases the difficulty in time synchronization.

When a network node device in a network processes a local transaction or communicates with other network node device, the communication is based on the logical time of a local device. The logical time of the local device is generated based on a physical clock signal. Specifically, the network node device has a physical clock signal generation unit, and the physical clock signal generation unit is a hardware device that can generate a physical clock signal. The physical time can be generated based on the physical clock signal, for example, $t_p = m \cdot T_p$, where $T_p$ is the clock cycle of the physical clock signal, and m is the number of the clock cycle(s) or the number of the rising edge(s) of the clock cycle(s) currently generated by the physical clock signal generation unit. The physical time may be described as follows: every time the number of the clock cycle(s) of the physical clock signal generated by the physical clock signal generation unit increases by 1, the physical time increases by $T_p$. For example, when the physical clock signal generation unit has not started to generate a physical clock signal, the physical time is 0; when the physical clock signal generated by the physical clock signal generation unit has one clock cycle, the physical time is $T_p$; when the physical clock signal has two clock cycles, the physical time is $2\,T_p$; and so on. According to a preset conversion rule, the physical time corresponding to each clock cycle can be converted into logical time. For example, $T_p$ is 0.01 seconds, for the first clock cycle in the physical clock signal (or the first generated rising edge), the logical time is 00:00 minutes and 0.01 seconds; for the second clock cycle of the physical clock signal (or the second generated rising edge), the logical time is 00:00 minutes and 0.02 seconds, and so on, for the 6000-th clock cycle in the physical clock signal (or the 6000-th generated rising edge), the logical time is 00:01 minute and 00 second.

Figure 2:
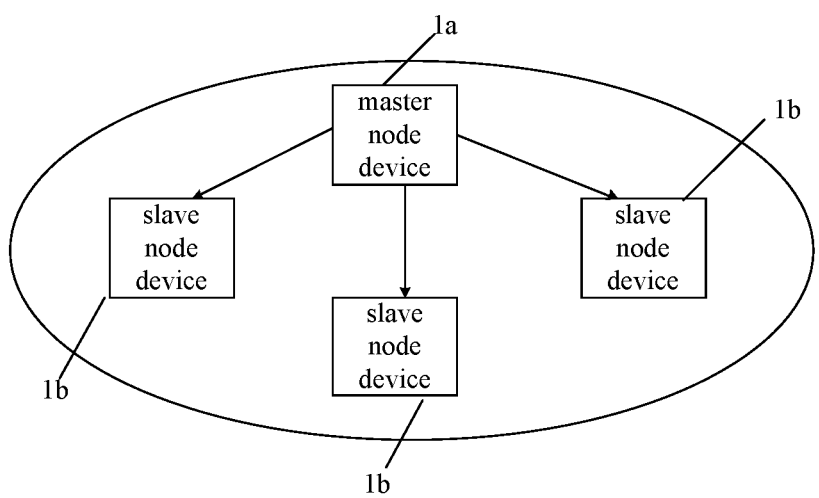
FIG. 2 shows a schematic diagram of a master-slave structure.

In a communication network, physical properties (e.g., process parameters, temperature drift parameters, aging coefficients, pressure drift coefficients, etc.) of the physical clock signal generation units of respective network node devices may be different, which may cause a difference in logical time between different network node devices, that is, the time is not synchronized. Network time synchronization structures are roughly divided into two categories, namely, plesiochronous structures and master-slave structures. FIG. 1 shows a schematic diagram of a plesiochronous structure, and FIG. 2 shows a schematic diagram of a master-slave structure. As shown in FIG. 1, each network node device 1 in the plesiochronous structure has an independent physical clock signal generation unit, and clock frequencies of physical clock signals of respective network node devices 1 are set to have a same value, but the physical properties of the physical clock signal generation units of respective network node devices 1 cannot be completely consistent, and shift of the physical time or logical time occurs due to different aging coefficients, temperature drift coefficients, pressure drift coefficients, process errors, etc. Therefore, the accuracy of network time synchronization with this structure will decrease as the working time increases. As shown in FIG. 2, network node devices in a master-slave structure are divided into a master node device 1a and slave node devices 1b, and each slave node device 1b receives time information sent from the master node device 1a. In a specific example, at regular intervals, the time of the master node device 1a is directly assigned to the slave node devices 1b, so as to realize time synchronization between the slave node devices 1b and the master node device 1a. However, this synchronization method has a certain risk. For example, time information of a slave node device 1b is 00:53 (i.e., 0 minute and 53 seconds), and time information sent from the master node device 1a is 00:52, as a result, when the time of the slave node device 1b is synchronized to 00:52, it is equivalent to that the slave node device 1b moves backwards in time, which is very unfavorable to system stability of the network node device.

In order to achieve network time synchronization, embodiments of the present disclosure provide a time synchronization method, which may be executed by a time synchronization device of a network node device. The time synchronization method in an embodiment of the present disclosure includes: an adjustment stage including N adjustment cycles, where N is an integer greater than 1, for example, N=10, or N=20, or N=30, and so on. FIG. 3 shows a schematic diagram of a time synchronization method according to some embodiments of the present disclosure. As shown in FIG. 3, the time synchronization method in an embodiment of the present disclosure includes step S110: in each adjustment cycle, generating a physical clock signal at least according to a pre-acquired frequency control word corresponding to the adjustment cycle, and obtaining logical time by conversion at least according to the physical clock signal and a physical time deviation E.

In some embodiments, the physical clock signal may be generated by the physical clock signal generation unit, and the physical clock signal generation unit may specifically generate the physical clock signal according to the frequency control word and a reference clock signal. In a case where the reference clock signal has a fixed clock frequency, for different frequency control words, frequencies (and cycles) of the physical clock signals generated by the physical clock signal generation unit are also different.

In the embodiments of the present disclosure, the physical clock signal generated in each adjustment cycle has a clock slope, and the clock slope of the physical clock signal generated in each adjustment cycle reaches its corresponding target value. The target values of the clock slopes of the physical clock signals in the N adjustment cycles gradually approach 1 from the first to the Nth adjustment cycles. It should be noted that the clock slope is the slope of a relationship curve between the physical time and the reference time. The physical time is the time generated based on the physical clock signal. The physical time deviation E is: a time difference between the reference time and the physical time corresponding to the physical clock signal of the Nth adjustment cycle at the end of the Nth adjustment cycle. The reference time is the time provided by other network node device, and the reference time may be generated according to the reference clock signal of other network node device. For example, when the network node device is in the master-slave structure, the reference clock signal is the physical clock signal of the master node device, and the reference time is the logical time generated by the master node device based on the reference clock signal; when the network node device in which the time synchronization device is located is in the plesiochronous structure, the reference time may be an average value of the logical time of a plurality of other network node devices.

Assuming that the clock frequency of the reference clock signal is f and the clock cycle of the reference clock signal is 1/f, the reference time increases by 1/f after each clock cycle, and the relationship between the reference time and the number p of clock cycles of the reference clock signal is: t=p·1/f, that is, the slope of the relationship curve between the reference time t and the number p of the clock cycles is 1/f, and after the slope is normalized, it is obtained that the reference time t'=p·1. In an ideal situation, the clock frequency of the physical clock signal of a network node device is f, but due to process errors, temperature drift, etc., the actual clock frequency of the physical clock signal will reach f+Δf, and the physical time increases by 1/(f+Δf) every time the physical clock signal passes one clock cycle. Therefore, the physical time of the network node device is $$t_p = p \cdot \frac{1}{f + \Delta f}.$$

Because the normalization process is carried out (i.e., the reference time is divided by 1/f) when calculating the reference time, the physical time is also normalized to obtain the normalized physical time $$t_p = p \cdot \left(1 - \frac{\Delta f}{f + \Delta f}\right) = p \cdot (1 + x), \text{ where } x = -\frac{\Delta f}{f + \Delta f},$$

x is a clock frequency deviation coefficient of the physical clock signal in an initial stage before the adjustment stage. It can be seen that the clock frequency deviation coefficient x is related to Δf, and |x|<1. It can also be seen that under ideal conditions, the clock frequency of the physical clock signal is equal to the clock frequency of the reference clock signal, and the value of the clock slope of the physical clock signal is 1; however, when the clock frequency of the physical clock signal shifts, the value of the clock slope of the physical clock signal is 1+x at the beginning. The difference between the physical time and the reference time will become larger and larger without any correction.

In the embodiments of the present disclosure, the clock slopes of the physical clock signals in the N adjustment cycles gradually approach 1 from the first to the Nth adjustment cycles, that is, the increasing rate of the physical time gradually approaches the increasing rate of the reference time, that is, the clock frequency of the physical clock signal gradually approaches the clock frequency of the reference clock signal. When N takes a relatively large value, the clock slope of the physical clock signal of the Nth adjustment cycle will be substantially close to 1. The "being substantially close to 1" here may be set according to application scenarios and protocols. For example, a value is considered to be substantially close to 1 when the difference between the value and 1 is less than 10', or, the difference between the value and 1 is less than 10'. Therefore, after N adjustment cycles, the difference between the physical time and the reference time no longer gradually increases when the physical clock signal continues to be generated according to the frequency control word of the Nth adjustment cycle. However, because there is a certain difference between the clock slope of the physical clock signal in the initial stage and 1, after N adjustment cycles, although the clock slope of the physical clock signal is substantially equal to 1, there is still a certain time difference between the physical time corresponding to the physical clock signal and the reference time. In the embodiments of the present disclosure, in each adjustment cycle, the logical time is obtained according to the physical clock signal and the physical time deviation E, which is beneficial to avoidance of the deviation between the logical time and the reference time at the end of the Nth adjustment stage. In a communication network, when a plurality of network node devices adopt the time synchronization method of the embodiments of the present disclosure, the logical time of different network node devices can be more accurate, and thus, the time of different network node devices can be synchronized.

It should be noted that the physical time deviation E may be obtained in advance before the adjustment stage. In each adjustment cycle, the logical time is obtained according to the physical clock signal and the physical time deviation E, and in this way, the logical time can be prevented from flowing backward.

In some embodiments, the physical clock signal may be generated based on a time average frequency (TAF). FIG. 4 is a schematic diagram showing principle of the time average frequency according to some embodiments of the present disclosure. According to the time average frequency technique, two clock signals with different cycles (a first cycle $T_A$ and a second cycle $T_B$) can be used to synthesize a required physical clock signal. As shown in FIG. 4, for the reference time unit $\Delta$ and the frequency control word F satisfying F=I+r, two time cycles can be obtained: a first cycle $T_A$ and a second cycle $T_B$. Here, the reference clock signal includes K (K being an integer greater than 1) reference pulses with evenly spaced phases, and a time span (e.g., phase difference) between any two adjacent reference pulses is a reference time unit. The first cycle $T_A$ and the second cycle $T_B$ may be expressed by the following formula (1) and formula (2), respectively. Here, I is the integer part of the frequency control word F, and r is the decimal part of the frequency control word F.

$$T_A = I \cdot \Delta \quad (1)$$

$$T_B = (I+1) \cdot \Delta \quad (2)$$

Using the first cycle $T_A$ and the second cycle $T_B$, a physical clock signal including two different cycles (different frequencies) can be generated in an alternating manner. The average cycle of the generated physical clock signal is $T_{TAF}$, and the average frequency $f_{TAF}$ is expressed by the following formula (3).

$$f_{TAF} = \frac{1}{T_{TAF}} = \frac{1}{(I+r) \cdot \Delta} = \frac{1}{F \cdot \Delta} = \frac{K \cdot f0}{F} \quad (3)$$

where f0 is the frequency of the reference pulse. When changing the frequency control word F, frequency switching of the clock frequency $f_{TAF}$ of the generated physical clock signal can be completed after two cycles.

FIG. 5 shows another schematic diagram of the time synchronization method in some embodiments of the present disclosure. As shown in FIG. 5, in some embodiments, the time synchronization method further includes steps S101 to S103 performed before the adjustment stage.

At step S101, the target value of the clock slope of the physical clock signal in each adjustment cycle is determined.

In some embodiments, the target value of the clock slope of the physical clock signal in each adjustment cycle is determined according to the clock frequency deviation coefficient x of the physical clock signal in the initial stage. The clock frequency deviation coefficient x may be obtained in advance by means of testing.

For example, if x is 0.1, the clock slope of the physical clock signal in the initial stage is 1+0.1=1.1; the target value of the clock slope of the physical clock signal in the first adjustment cycle is 1+0.09=1.09; the target value of the clock slope of the physical clock signal in the second adjustment cycle is 1+0.08=1.08, the target value of the clock slope of the physical clock signal of the third adjustment cycle is 1+0.07=1.07, and so on.

In some embodiments, the target value $S_1$ of the clock slope of the physical clock signal in the first adjustment cycle is determined according to the following formula (4).

$$S_1 = S_0(1-x) \quad (4)$$

where x is the pre-acquired clock frequency deviation coefficient of the physical clock signal in the initial stage; $S_0$ is the value of the clock slope of the physical clock signal generated according to the initial frequency control word in the initial stage, $S_0 = 1+x$.

The target value $S_2$ of the clock slope of the physical clock signal in the second adjustment cycle satisfies: $S_2 = S_1(1+x^2) = 1-x^4$; the target value $S_3$ of the clock slope of the physical clock signal in the third adjustment cycle satisfies: $S_3 = S_2(1+x^4) = 1-x^8$; and in this way, the target value $S_n$ of the clock slope of the physical clock signal in the nth adjustment cycle is determined according to the following formula (5).

$$S_n = S_{n-1}(1+x^{2^{n-1}}) = 1-x^{2^n} \quad (5)$$

where $S_{n-1}$ is the target value of the clock slope of the physical clock signal in the (n−1)-th adjustment cycle, n is an integer, and $1 < n \leq 1$.

Since x<1 and $x^{2^n}$ is close to 0, the target value $S_N$ of the clock slope of the physical clock signal in the last adjustment cycle is close to 1. Furthermore, the larger the value of N, the smaller the difference between $S_N$ and 1. In a specific example, N is set between 10 and 15. For example, N=10.

At step S102, for each adjustment cycle, the frequency control word corresponding to the adjustment cycle is determined according to the target value of the clock slope of the physical clock signal in the adjustment cycle and the difference between the reference time corresponding to the beginning of the adjustment cycle and the reference time corresponding to the end of the adjustment cycle.

For example, for each adjustment cycle, a difference between the physical time corresponding to the beginning of the adjustment cycle and the physical time corresponding to the end of the adjustment cycle is determined according to the target value of the clock slope of the physical clock signal in the adjustment cycle and the difference between the reference time corresponding to the beginning of the adjustment cycle and the reference time corresponding to the end of the adjustment cycle; a target value of the frequency of the physical clock signal in the adjustment cycle is determined according to the difference between the physical time corresponding to the beginning of the adjustment cycle and the physical time corresponding to the end of the adjustment cycle, and then the frequency control word is determined according to the target value of the frequency of the physical clock signal. It can be understood that after the target value of the frequency of the physical clock signal is determined, the frequency control word can be determined according to the relationship between the frequency of the physical clock signal and the frequency control word (see the above formula (3)).

At step S103, a physical time deviation is determined.

At the end of the Nth adjustment cycle, the reference time $T_{ref}$ satisfies $T_{ref}=M\cdot\Delta t\cdot(N+1)$, M is the number of clock cycles of the physical clock signal in the adjustment cycle, that is, every time the total number of clock cycles of the physical clock signal increases by M, one adjustment cycle passes. For example, M=1000, $\Delta t$ is the standard clock cycle. The standard clock cycle refers to the clock cycle in the condition that the physical clock signal has no frequency drift, i.e., the clock cycle of the reference clock signal. The physical time $T_{phy}$ generated according to the physical clock signal is calculated according to the following formula (6).

$$T_{phy}=M\cdot\Delta t\cdot[(1+x)+(1-x^2)+(1-x^4)+\ldots+(1-x^{2^N})] \quad (6)$$

In some embodiments, the physical time deviation E is calculated according to the following formula (7).

$$E=T_{phy}-T_{ref}=(x-x^2-x^4-\ldots-x^{2^n}) \quad (7)$$

In some other embodiments, the physical time deviation E is calculated according to the following formula (8).

$$E = M\cdot\Delta t\cdot\left(x - \frac{x^2}{1-x^2}\right) \quad (8)$$

Compared with formula (7), the calculation process of formula (8) is simpler, which can improve the efficiency of calculating the physical time deviation E.

It should be noted that formula (8) is obtained by simplifying the above formula (7). Although the calculation rules of the two formulas are different, the calculation results are basically the same. The process of simplifying formula (7) is introduced below.

It is defined that $S_{sq}=x^2+x^4+x^8+x^{16}+\ldots+x^{2^N}$, then $E=M\cdot\Delta t\cdot(x-S_{sq})$.

It is known that $$S_t = x + x^2 + x^3 + x^4 + \cdots + x^t = \frac{x(1-x^t)}{1-x},$$

let $t=2^n$, and it is defined that:

$$S_i=S_t-x-S_{sq}=x^3+x^5+x^6+x^7+x^9+x^{10}+\ldots+x^{t-1}=x(x^2+x^4+x^8+\ldots+x^t)-x^{t+1}+x^6+x^7+\ldots+x^{t-1}\approx x\cdot S_{sq}$$

Thus, it can be obtained that $S_t-x-S_{sq}=S_i=x\cdot S_{sq}$, and then it is obtained that $$S_{sq} = \frac{S_t - x}{1+x} = \frac{\frac{x}{1-x}-x}{1+x} = \frac{x^2}{1-x^2}.$$

Therefore, it can be obtained that $$E = M\cdot\Delta t\cdot(x - S_{sq}) = M\cdot\Delta t\cdot\left(x - \frac{x^2}{1-x^2}\right).$$

Figure 6:
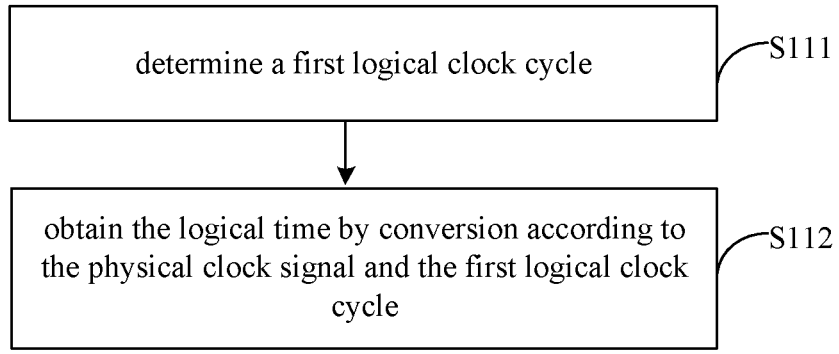
FIG. 6 shows a schematic diagram of a method for obtaining logical time in each adjustment cycle according to some embodiments of the present disclosure.

FIG. 6 shows a schematic diagram of a method for obtaining logical time in each adjustment cycle according to some embodiments of the present disclosure. As shown in FIG. 6, the step of obtaining logical time at least according to the physical clock signal and the physical time deviation E in each adjustment cycle includes step S111 and step S112.

At step S111, a first logical clock cycle $T_{l\_1}$ is determined, and the first logical clock cycle $T_{l\_1}$ is determined according to the following formula (9):

$$T_{l\_1} = \Delta t - \frac{E}{N\cdot M} \quad (9)$$

where N is the total number of synchronization cycles, and $\Delta t$ is the standard clock cycle.

At step S112, the logical time is obtained by conversion according to the physical clock signal and the first logical clock cycle.

For example, every time the total number of the clock cycles of the physical clock signal that is currently generated increases by 1, $T_{l\_1}$ is added to the current logical time.

Figure 7:
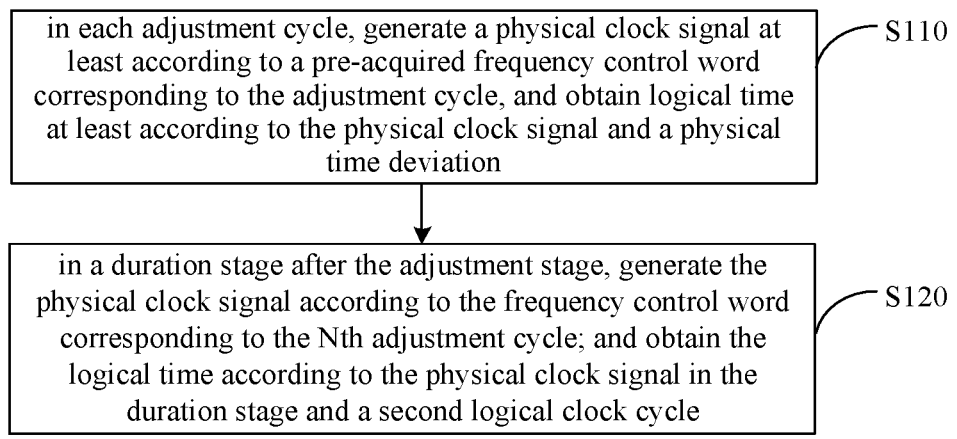
FIG. 7 shows another schematic diagram of a time synchronization method according to some embodiments of the present disclosure.

FIG. 7 shows another schematic diagram of the time synchronization method according to some embodiments of the present disclosure. As shown in FIG. 7, in addition to the above step S110, the time synchronization method includes step S120: in a duration stage after the adjustment stage, generating the physical clock signal according to the frequency control word corresponding to the Nth adjustment cycle; and obtaining the logical time by conversion according to the physical clock signal in the duration stage and a second logical clock cycle, wherein the second logical clock cycle is equal to the standard clock cycle $\Delta t$.

For example, every time the number of valid edges (e.g., rising edges) of the physical clock signal increases by 1, the second logical clock cycle is added to the current logical time.

Figure 8:
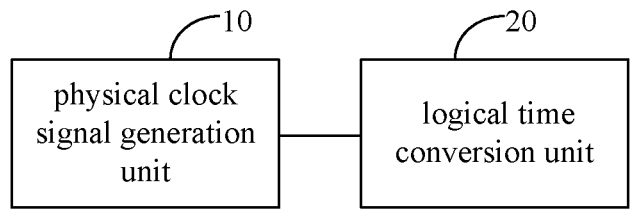
FIG. 8 shows a schematic block diagram of a time synchronization device according to some embodiments of the present disclosure.

Embodiments of the present disclosure also provide a time synchronization device, which is used in a network node device and configured to execute the time synchronization method provided in the above embodiments of the present disclosure. FIG. 8 shows a schematic block diagram of a time synchronization device according to some embodiments of the present disclosure. As shown in FIG. 8, the time synchronization device includes: a physical clock signal generation unit 10 and a logical time conversion unit 20.

The physical clock signal generation unit 10 is configured to generate, in each adjustment cycle of the adjustment stage, a physical clock signal at least according to a pre-acquired frequency control word corresponding to the adjustment cycle. The adjustment stage includes N adjustment cycles, and N is an integer greater than one. The physical clock signal generated in each adjustment cycle has a clock slope, and the clock slopes of the physical clock signals of the N adjustment cycles gradually approach 1 from the first to the Nth adjustment cycles. Here, the clock slope is the slope of a relationship curve between the physical time generated based on the physical clock signal and the reference time.

In some embodiments, the physical clock signal generation unit 10 is configured to generate the physical clock signal according to a frequency control word F and a reference clock signal. The reference clock signal may specifically include K reference pulses with evenly spaced phases, and a time span (e.g., phase difference) between two adjacent reference pulses is a reference time unit. In a case where the pulse frequency of the reference clock signal is fixed, when the frequency control word changes, the frequency (and cycle) of the physical clock signal generated by the physical clock signal generation unit 10 also changes accordingly.

Figure 9:
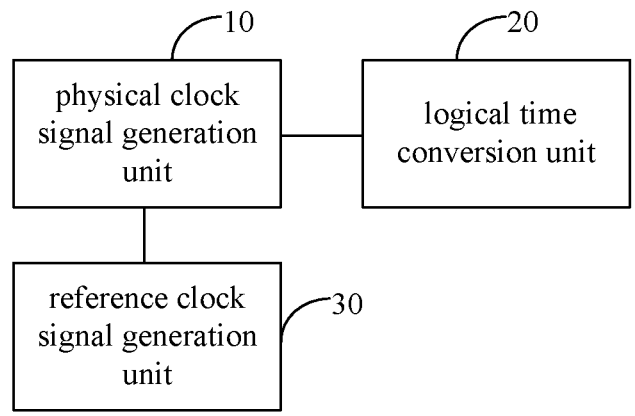
FIG. 9 shows another schematic block diagram of a time synchronization device according to some embodiments of the present disclosure.

FIG. 9 shows another schematic block diagram of a time synchronization device according to some embodiments of the present disclosure. As shown in FIG. 9, in some embodiments, the time synchronization device may further include a reference clock signal generation unit 30 configured to generate a reference clock signal, and the reference clock signal includes K (K being an integer greater than 1) pulses with evenly spaced phases. The reference clock signal generation unit 30 may be a self-excited oscillator.

Figure 10:
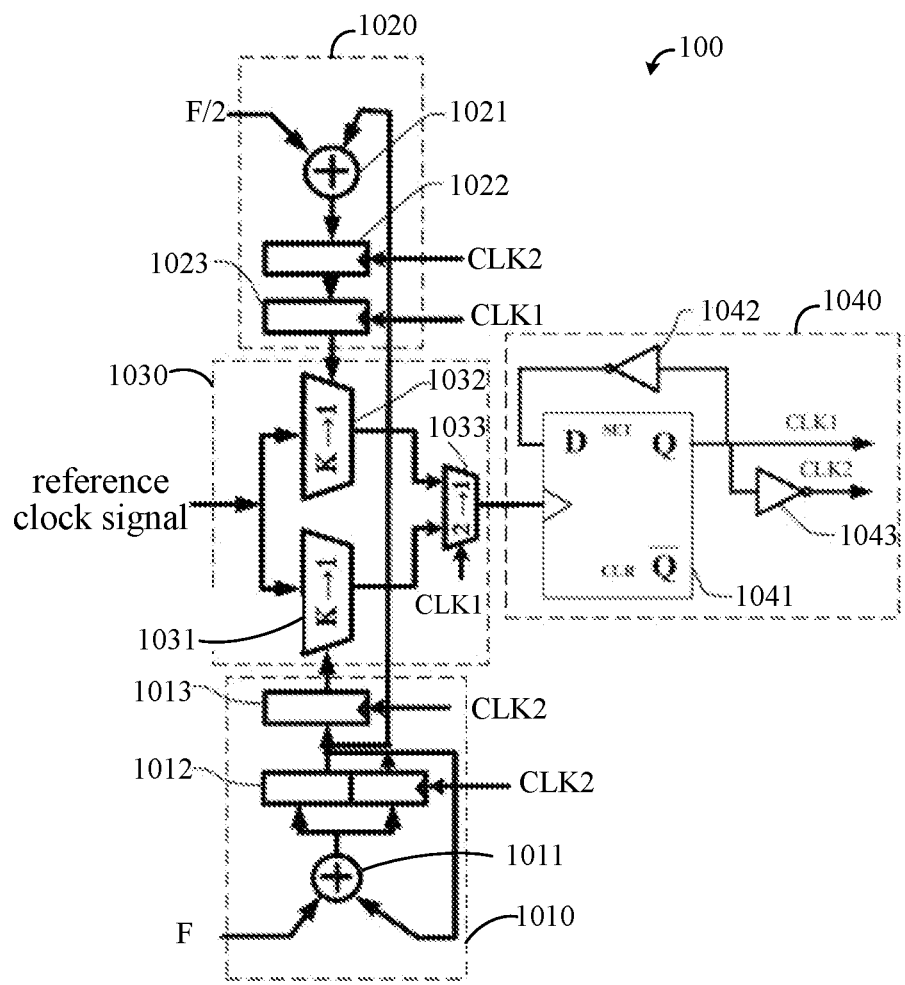
FIG. 10 shows a circuit diagram of a time average frequency direct period synthesizer according to some embodiments of the present disclosure.

As described above, the physical clock signal may be generated based on a time average frequency (TAF). In some embodiments, the physical clock signal generation unit 10 adopts a time average frequency direct period synthesizer based on a Time Average Frequency-Direct Period Synthesis (TAF-DPS) circuit architecture. FIG. 10 shows a circuit diagram of a time average frequency direct period synthesizer according to some embodiments of the present disclosure. As shown in FIG. 10, the time average frequency direct period synthesizer 100 may include a first input module, a second input module 1030, and an output module 1040.

For example, as shown in FIG. 10, the first input module includes a first logic control circuit 1010 and a second logic control circuit 1020. The first logic control circuit 1010 includes a first adder 1011, a first register 1012, and a second register 1013. The second logic control circuit 1020 may include a second adder 1021, a third register 1022, and a fourth register 1023.

The second input module 1030 includes a first K→1 multiplexer 1031, a second K→1 multiplexer 1032, and a 2→1 multiplexer 1033. Each of the first K→1 multiplexer 1031 and the second K→1 multiplexer 1032 includes a plurality of input terminals, a control input terminal, and an output terminal. The plurality of input terminals of the first K→1 multiplexer 1031 and the plurality of input terminals of the second K→1 multiplexer 1032 are respectively configured to receive K pulses with evenly spaced phases output by the reference clock signal generation unit 30. The 2→1 multiplexer 1033 includes a control input terminal, an output terminal, a first input terminal configured to receive an output of the first K→1 multiplexer 1031, and a second input terminal configured to receive an output of the second K→1 multiplexer 1032. For example, the time span (e.g., phase difference) between any two adjacent pulses among the K pulses with evenly spaced phases may be the reference time unit Δ.

For example, as shown in FIG. 10, the output module 1040 includes a trigger circuit. The trigger circuit is configured to generate a pulse train. The trigger circuit includes a D flip-flop 1041, a first inverter 1042, and a second inverter 1043. The D flip-flop 1041 includes a data input terminal, a clock input terminal configured to receive an output from the output terminal of the 2→1 multiplexer 1033, and an output terminal configured to output a first clock signal CLK1. The first inverter 1042 includes an input terminal configured to receive the first clock signal CLK1 and an output terminal configured to output a signal to the data input terminal of the D flip-flop 1041. The second inverter 1043 includes an input terminal configured to receive the first clock signal CLK1 and an output terminal configured to output a second clock signal CLK2.

The first clock signal CLK1 is output to the control input terminal of the 2→1 multiplexer 1033, and the output terminal of the first inverter 1042 is coupled to the data input terminal of the D flip-flop 1041.

For example, the first adder 1011 may add the frequency control word F and the most significant bit stored in the first register 1012, and then the addition result is saved in the first register 1012 at a rising edge of the second clock signal CLK2; alternatively, the first adder 1011 may add the frequency control word F and all the information stored in the first register 1012, and then the addition result is saved in the first register 1012 at the rising edge of the second clock signal CLK2. At the next rising edge of the second clock signal CLK2, the most significant bit stored in the first register 1012 will be stored in the second register 1013, and serve as a selection signal of the first K→1 multiplexer 1031, which is used for selecting one pulse from the K pulses as an output signal of the first K→1 multiplexer 1031.

For example, the second adder 1021 may add the frequency control word F/2 and the most significant bit stored in the first register 1012, and then the addition result is saved in the third register 1022 at a rising edge of the second clock signal CLK2. At the next rising edge of the first clock signal CLK1, information stored in the third register 1022 will be stored in the fourth register 1023, and serve as a selection signal of the second K→1 multiplexer 1023, which is used for selecting one pulse from the K pulses as an output signal of the second K→1 multiplexer 1023.

The 2→1 multiplexer 1033 may select, at a rising edge of the first clock signal CLK1, one of the output signal from the first K→1 multiplexer 1031 and the output signal from the second K→1 multiplexer 1032 as an output signal of the 2→1 multiplexer 1033 to serve as an input clock signal of the D flip-flop 1041.

For example, one of the output terminal of the D flip-flop 1041 and the output terminal of the second inverter 1043 may be used as an output of the time average frequency direct period synthesizer 100.

For example, the selection signal output by the second register 1013 may be used to select a falling edge of a synthesized clock signal generated by the time average frequency direct period synthesizer 100, and the selection signal output by the fourth register 1023 may be used for selecting a rising edge of the synthesized clock signal generated by the time average frequency direct period synthesizer 100, the signal fed back by the first register 1012 to the first adder 1011 may be used for controlling cycle switching of the synthesized clock signal generated by the time average frequency direct period synthesizer 100.

In some embodiments, the logical time conversion unit 20 is configured to obtain the logical time by conversion at least according to the received physical clock signal and the physical time deviation E in each adjustment cycle; the physical time deviation E is: a time difference between the reference time and the physical time corresponding to the physical clock signal of the Nth adjustment cycle at the end of the Nth adjustment cycle.

In some embodiments, the logical time conversion unit 20 is specifically configured to determine a first logical clock cycle $T_{L\_1}$, and obtain the logical time by conversion according to the physical clock signal and the first logical clock cycle in each adjustment cycle, where the first logical clock cycle $T_{L\_1}$ satisfies:

$$T_{L\_1} = \Delta t - \frac{E}{N \cdot M}.$$

Here, $\Delta t$ is the standard clock cycle. For example, in the adjustment stage, every time the logical time conversion unit 20 receives one valid edge of the physical clock signal, the first logical clock cycle is added to the current logical time.

In some embodiments, the physical clock signal generation unit 10 is further configured to generate the physical clock signal according to the frequency control word corresponding to the Nth adjustment cycle in a duration stage after the adjustment stage. The logical time conversion unit 20 is also configured to obtain the logical time by conversion according to the physical clock signal of the duration stage and a second logical clock cycle in the duration stage, where the second logical clock cycle is equal to the standard clock cycle. For example, in the duration stage, every time the logical time conversion unit 20 receives one valid edge of the physical clock signal, the second logical clock cycle is added to the current logical time.

Figure 11:
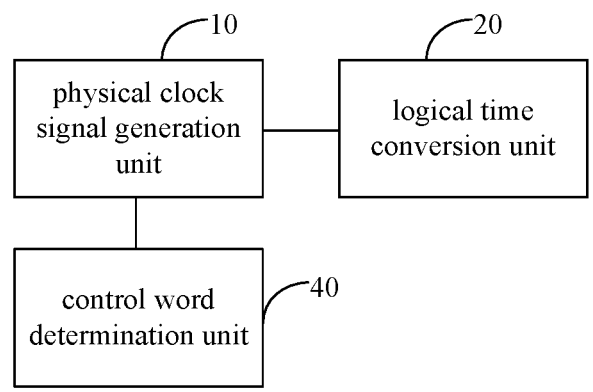
FIG. 11 shows another schematic block diagram of a time synchronization device according to some embodiments of the present disclosure.

FIG. 11 shows another schematic block diagram of a time synchronization device according to some embodiments of the present disclosure. As shown in FIG. 11, in some embodiments, the time synchronization device further includes: a control word determination unit 40. The control word determination unit 40 is configured to determine a target value of a clock slope of the physical clock signal in each adjustment cycle before the adjustment stage, and determine the frequency control word corresponding to the adjustment cycle according to the target value of the clock slope of the physical clock signal in the adjustment cycle and a difference between the reference time corresponding to the beginning of the adjustment cycle and the reference time corresponding to the end of the adjustment cycle.

In some embodiments, the target value $S_1$ of the clock slope of the physical clock signal in the first adjustment cycle satisfies: $S_1=S_0(1-x)$, where x is a pre-acquired clock frequency deviation coefficient of the physical clock signal in the initial stage; $S_0$ is the value of the clock slope of the physical clock signal generated according to the initial frequency control word in the initial stage, and $S_0=1+x$. The target value $S_2$ of the clock slope of the physical clock signal in the second adjustment cycle satisfies: $S_2=S_1(1+x^2)=1-x^4$; the target value $S_3$ of the clock slope of the physical clock signal in the third adjustment cycle satisfies: $S_3=S_2(1+x^4)=1-x^8$; and the target value $S_n$ of the clock slope of the physical clock signal in the nth adjustment cycle satisfies: $S_n=S_{n-1}(1+x^{2^{n-1}})=1-x^{2^n}$. Here, $S_{n-1}$ is the target value of the clock slope of the physical clock signal in the (n−1)-th adjustment cycle, n is an integer, and $1<n\leq N$.

Since $x<1$ and $x^{2^n}$ is close to 0, the target value $S_N$ of the clock slope of the physical clock signal in the last adjustment cycle is close to 1. Furthermore, the larger the value of N, the smaller the difference between $S_N$ and 1. In a specific example, N is set between 10 and 15. For example, N=10.

As shown in FIG. 11, the time synchronization device further includes: a first time deviation determination unit 50, and the first time deviation determination unit 50 is configured to determine the physical time deviation E according to the above formula (7) before the adjustment stage.

Figure 12:
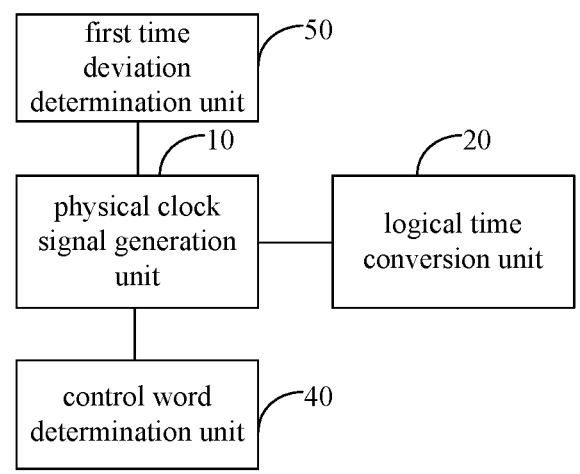
FIG. 12 shows another schematic block diagram of a time synchronization device according to some embodiments of the present disclosure.

FIG. 12 shows another schematic block diagram of a time synchronization device according to some embodiments of the present disclosure. As shown in FIG. 12, the time synchronization device includes the above physical clock signal generation unit 10, the logical time conversion unit 20, and the control word determination unit 40, and further includes: a second time deviation determination unit 50, the second time deviation determination unit 50 is configured to determine the physical time deviation E according to the above formula (8) before the adjustment stage.

Embodiments of the present disclosure also provide a network node device, which includes the time synchronization device provided by the embodiments of the present disclosure.

The network node device of the embodiments of the present disclosure can generate accurate logical time with the above time synchronization method, thereby improving time synchronization of multiple network node devices.

In the present disclosure, simulations are also performed on the effect of network time synchronization in different situations. It is assumed that there are ten free-running network node devices in a network, and relevant parameters in the simulation are as follows: the standard clock cycle $\Delta t$ satisfies: $\Delta t=0.01 \cdot t_0$, $t_0$ is a preset time unit, for example, the preset time unit is 1 second, or 1 millisecond. The number M of clock cycles of the physical clock signal in each adjustment cycle satisfies M=1000, and the clock frequency deviation coefficients of ten network node devices are respectively: ±0.1, ±0.08, ±0.06, ±0.04, ±0.02. The clock frequency deviation coefficient of each network node device indicates degrees of temperature drift and aging drift of the physical clock signal generation unit 10 of the network node device. Each network node device corresponds to random noise with a mean distribution, which is used to simulate actual environmental changes, transmission delay, etc., and the random noise is expressed as: noise=±0.02·$\Delta t$.

Figure 13:
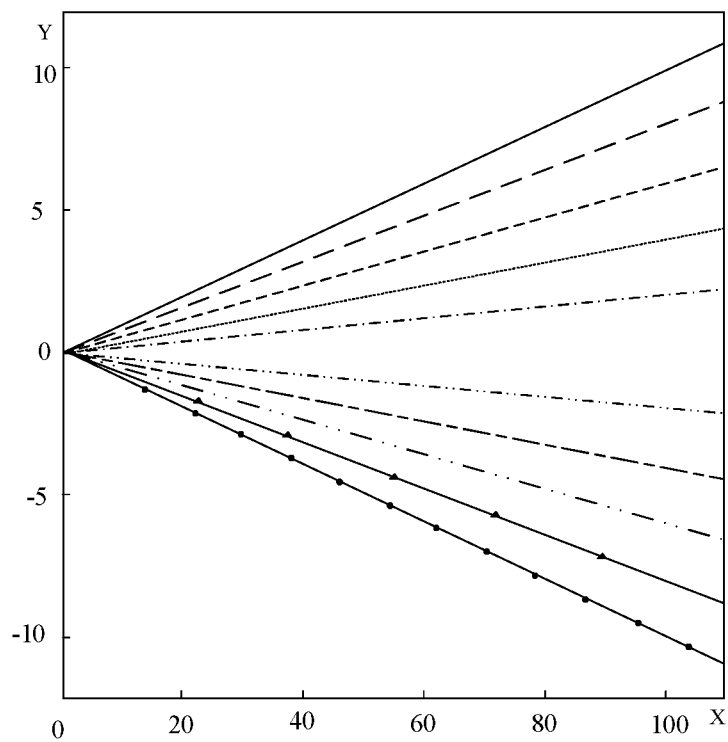
FIG. 13 shows time offset curves of ten network node devices in a network in the absence of time synchronization.
Figure 14:
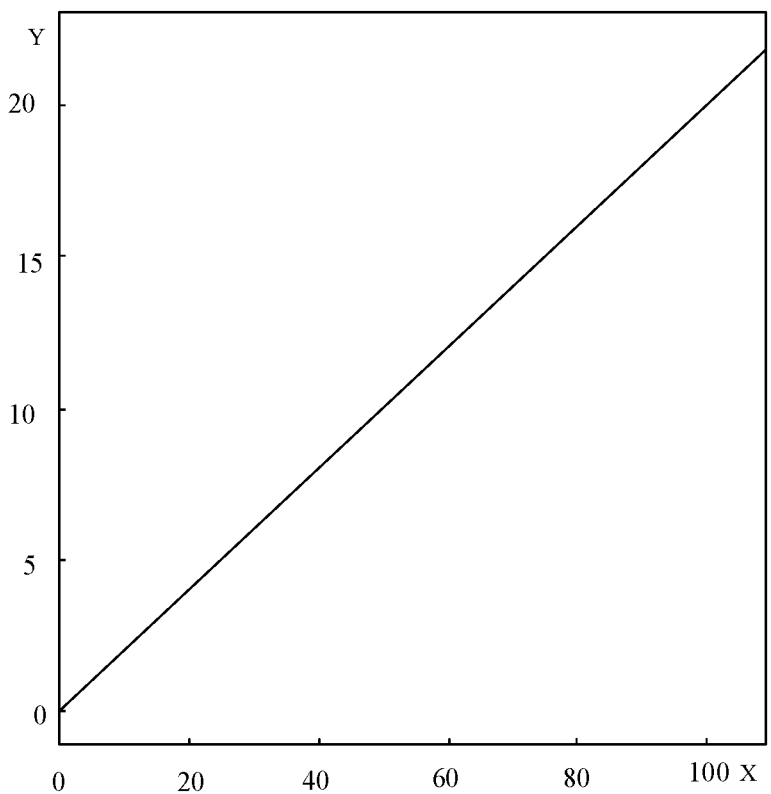
FIG. 14 shows a synchronization error curve of network time in the absence of time synchronization.

In a first case, the ten network node devices in the network are not time synchronized. FIG. 13 shows time offset curves of ten network node devices in the network that are not time synchronized. In FIG. 13, the horizontal axis X represents the real time (in the unit that is the preset time unit), the vertical axis Y represents the time difference (in the unit that is the preset time unit) between the logical time and reference time, and the ten curves respectively represent the time offset curves of ten network node devices. It can be seen from FIG. 13 that the network node devices have the same logical time at the initial moment, and different time differences are generated between the logical time and the reference time of different network node devices over time, resulting in that the logical time of different network node devices is not synchronized. FIG. 14 shows a synchronization error curve of network time in the absence of time synchronization, in which the vertical axis Y represents a synchronization error of the network time, and the synchronization error of the network time is: the maximum value of differences in the logical time between every two network node devices in the network; the horizontal axis X represents the real time. The larger the synchronization error, the worse the effect of network time synchronization. It can be seen from FIG. 14 that the synchronization error of the network time gradually increases over time.

Figure 15:
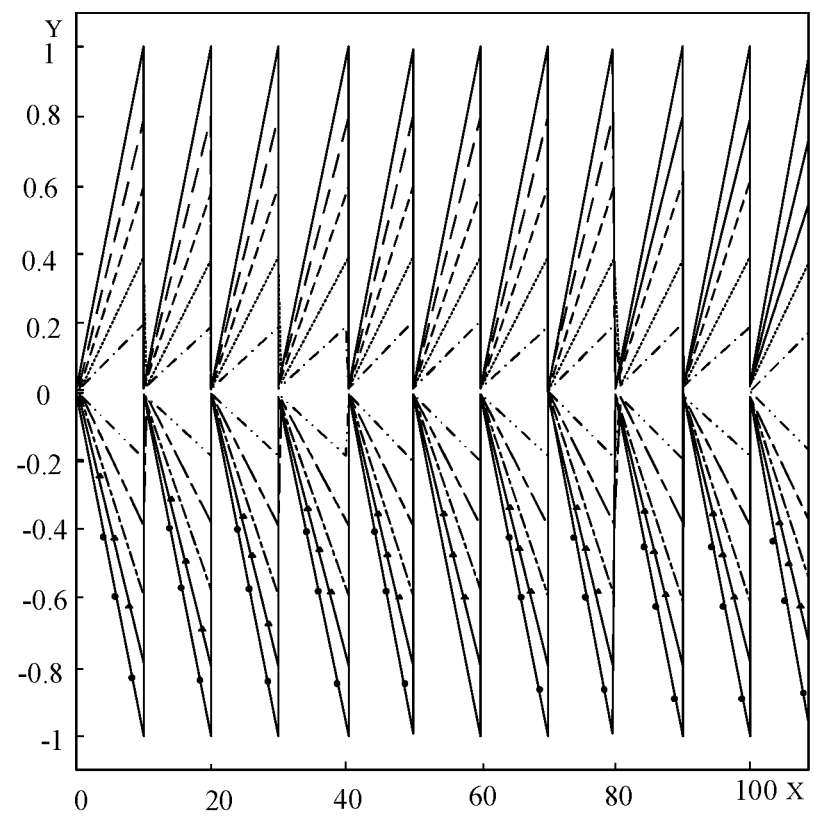
FIG. 15 shows a time offset curve of each network node device in a case of performing time synchronization according to a time synchronization method in a comparative example.
Figure 16:
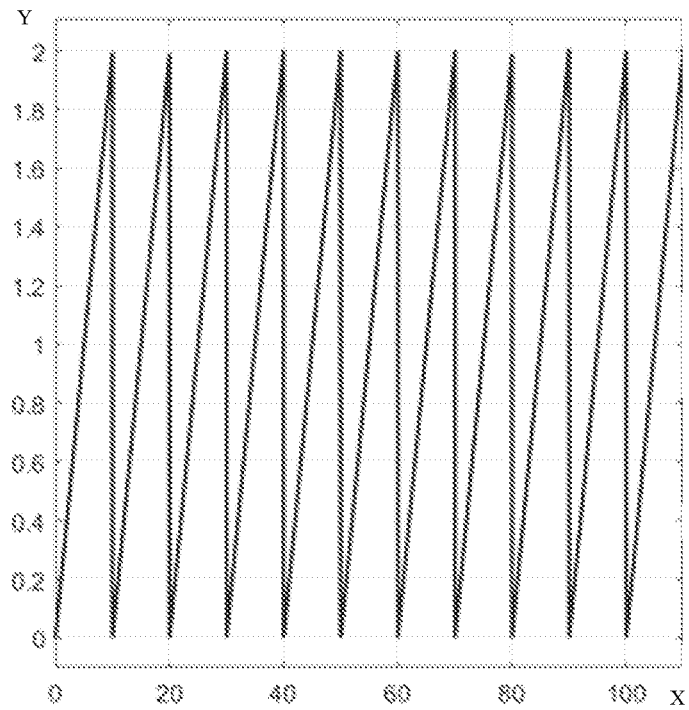
FIG. 16 shows a synchronization error curve of network time in the case of performing time synchronization according to the time synchronization method in the comparative example.

In a second case, each network node device adopts a time synchronization method in a comparative example for time synchronization. The time synchronization method in the comparative example is that: time synchronization is performed on ten network node devices at regular intervals, and the time synchronization is performed in such a manner that the current logical time of each network node device is directly corrected to the current reference time. FIG. 15 shows a time offset curve of each network node device in a case where time synchronization is performed according to the time synchronization method in the comparative example; FIG. 16 shows a synchronization error curve of network time in the case where time synchronization is performed according to the time synchronization method in the comparative example. It can be seen from FIG. 15 and FIG. 16 that with the time synchronization method in the comparative example, the synchronization error of the network time can be controlled within a certain range. However, after the time synchronization is performed once, a difference in the logical time between respective network node devices will occur again. In addition, directly correcting the logical time of the network node device to the reference time may cause the logical time of the network node device to have a negative step. For example, the logical time of a network node device is 00:43 (that is, 0 minutes and 43 seconds), the reference time is 00:42, and if the logical time is corrected to 00:42, from the view of time flow, the network node device moves backward in time, which is very unfavorable to the system stability of the network node device.

Figure 17:
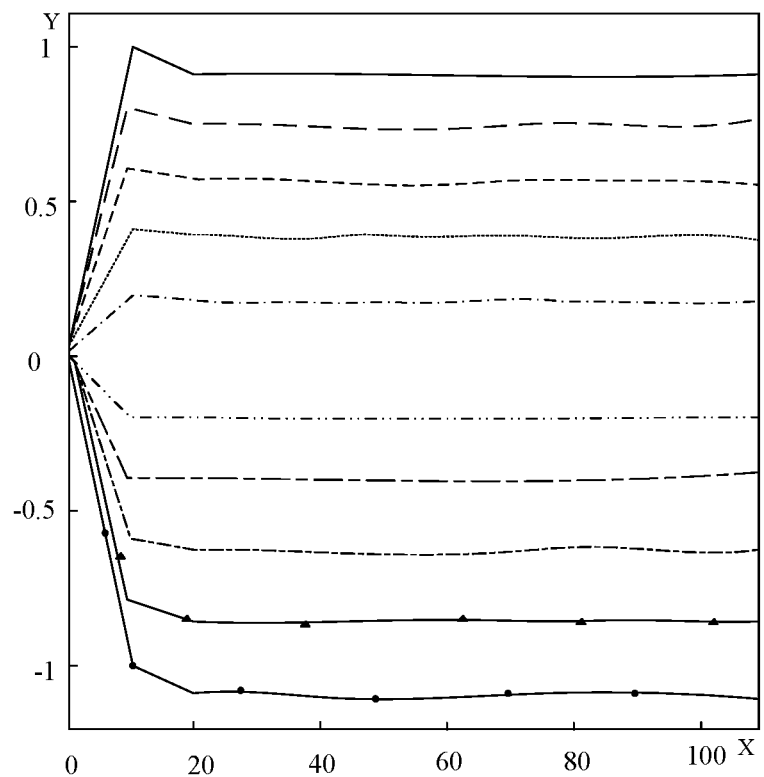
FIG. 17 shows a time offset curve of each network node device in a case of performing time synchronization according to a time synchronization method in another comparative example.
Figure 18:
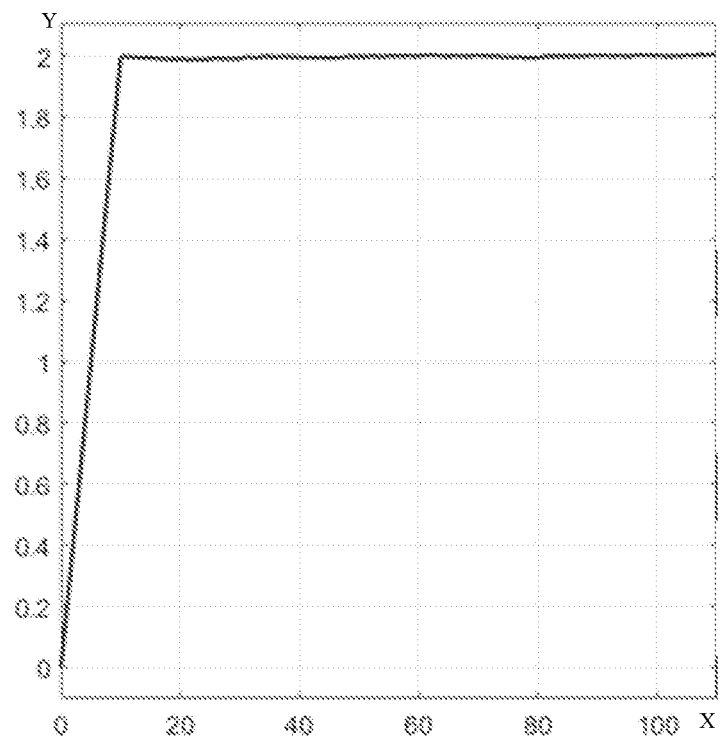
FIG. 18 shows a synchronization error curve of network time in the case of performing time synchronization according to the time synchronization method in another comparative example.

In a third case, each network node device adopts a time synchronization method in another comparative example for time synchronization. The time synchronization method in another comparative example is that: in each adjustment cycle of the adjustment stage, the frequency of the physical clock signal of each network node device is adjusted such that for any network node device, the clock slope of the physical clock signal gradually approaches 1 from the first adjustment cycle to the Nth adjustment cycle, and the logical time is obtained by conversion according to the physical clock signal. FIG. 17 shows a time offset curve of each network node device in a case where time synchronization is performed according to the time synchronization method in another comparative example; FIG. 18 shows a synchronization error curve of network time in the case where time synchronization is performed according to the time synchronization method in another comparative example. It can be seen from FIG. 17 and FIG. 18 that after a plurality of adjustment cycles, the deviation between the logical time of each network node device and the reference time remains stable, and the synchronization error of the network time remains at a stable deviation value.

Figure 19:
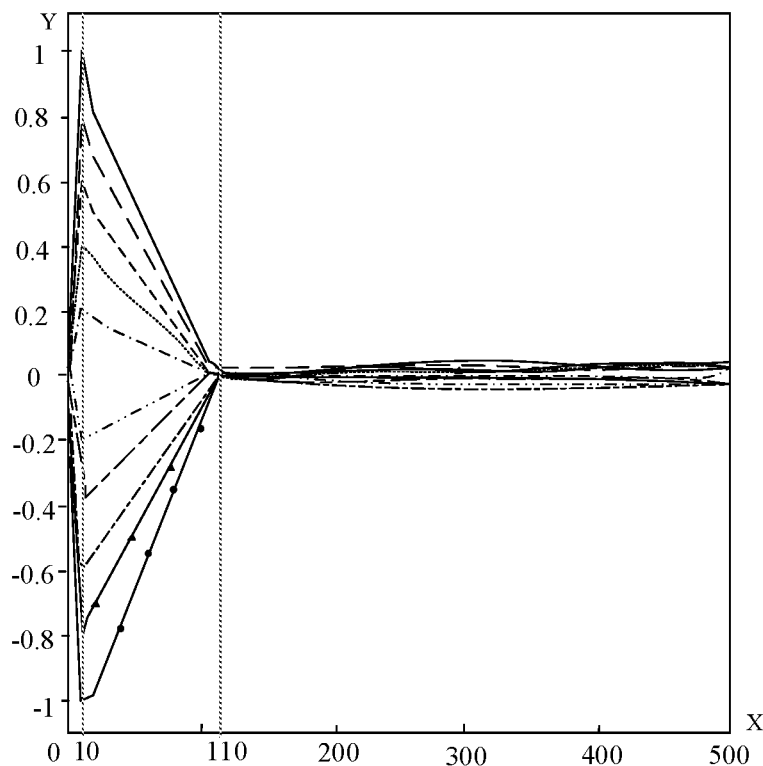
FIG. 19 shows a time offset curve of each network node device in a case of performing time synchronization according to the time synchronization method shown in FIG. 7.
Figure 20:
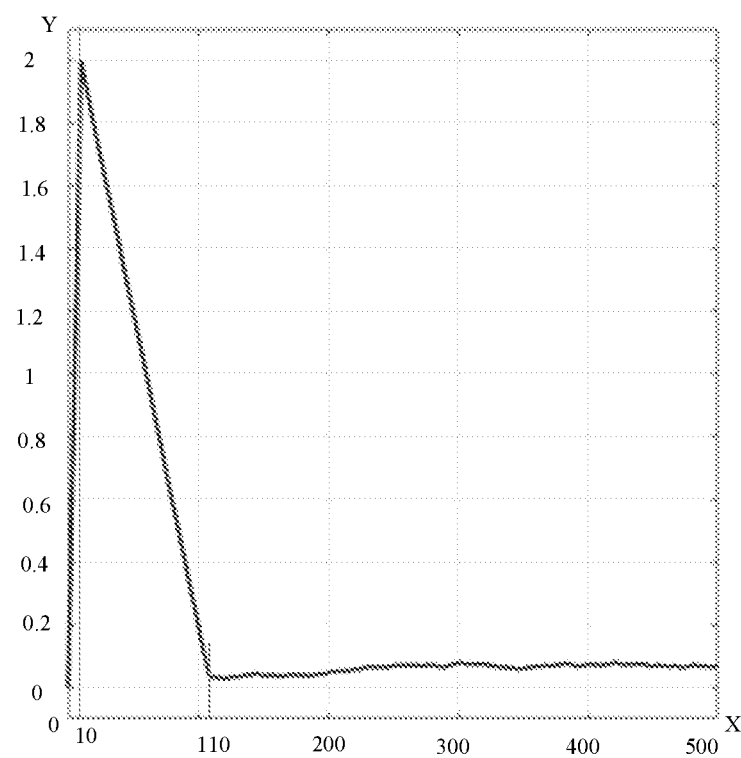
FIG. 20 shows a synchronization error curve of network time in the case of performing time synchronization according to the time synchronization method shown in FIG. 7.

In a fourth case, each network node device adopts the time synchronization method shown in FIG. 7 for time synchronization, and FIG. 19 shows a time offset curve of each network node device in a case where time synchronization is performed according to the time synchronization method shown in FIG. 7; FIG. 20 shows a synchronization error curve of network time in the case where time synchronization is performed according to the time synchronization method shown in FIG. 7. The adjustment stage includes 10 adjustment cycles; when the time on the horizontal axis X is 10, the first adjustment cycle begins, and when the time on the horizontal axis X is 110, the 10th adjustment cycle ends. It can be seen from FIG. 19 and FIG. 20 that the logical time of each network node device can be substantially consistent with the reference time after the 10th adjustment cycle by using the time synchronization method of the embodiments of the present disclosure. The synchronization error of the entire network is substantially zero, and is only affected by random noise.

In the embodiments of the present disclosure, after a plurality of adjustment cycles, the logical time of the network node device obtained by conversion is more accurate, so that the time synchronization of each network node device in the network is improved, and the security and reliability of the network are fully guaranteed.

It could be understood that the above implementations are merely exemplary implementations used to illustrate the principle of the present disclosure, but the present disclosure is not limited thereto. For those of ordinary skill in the art, various modifications and improvements can be made without departing from the spirit and essence of the present disclosure, and these modifications and improvements are also deemed to be within the protection scope of the present disclosure.

What is claimed is:

1. A time synchronization method, comprising: an adjustment stage comprising N adjustment cycles, N being an integer greater than 1;
   in each adjustment cycle, generating a physical clock signal at least according to a pre-acquired frequency control word corresponding to the adjustment cycle, and obtaining logical time at least according to the physical clock signal and a physical time deviation;
   wherein a clock slope of the physical clock signal generated in each adjustment cycle reaches its corresponding target value, and differences between the target values of the clock slopes of the physical clock signals in the N adjustment cycles and 1 monotonically decrease from a first adjustment cycle to an Nth adjustment cycle; the clock slope is a slope of a relationship curve between physical time generated based on the physical clock signal and reference time; and the physical time deviation is: a time difference between the reference time and the physical time corresponding to the physical clock signal in the Nth adjustment cycle at the end of the Nth adjustment cycle.

2. The time synchronization method of claim 1, wherein before the adjustment stage, the time synchronization method further comprises:
   determining the target value of the clock slope of the physical clock signal in each adjustment cycle; and
   for each adjustment cycle, determining the frequency control word corresponding to the adjustment cycle according to the target value of the clock slope of the physical clock signal in the adjustment cycle and a difference between the reference time corresponding to the beginning of the adjustment cycle and the reference time corresponding to the end of the adjustment cycle.

3. The time synchronization method of claim 2, wherein the target value $S_1$ of the clock slope of the physical clock signal in the first adjustment cycle is determined according to the following formula:

$$S_1 = S_0(1-x)$$

where x is a pre-acquired clock frequency deviation coefficient of the physical clock signal in an initial stage; $S_0$ is a value of the clock slope of the physical clock signal generated according to an initial frequency control word in the initial stage, $S_0 = 1+x$; and
the target value $S_n$ of the clock slope of the physical clock signal of an nth adjustment cycle is determined according to the following formula:

$$S_n = S_{n-1}(1 + x^{2^{n-1}}) = 1 - x^{2^n}$$

where $S_{n-1}$ is the target value of the clock slope of the physical clock signal in a (n−1)-th adjustment cycle, n is an integer, and $1 < n \leq N$.

4. The time synchronization method of claim 2, further comprising, before the adjustment stage, determining the physical time deviation E according to the following formula:

$$E = M \cdot \Delta t \cdot (x - x^2 - x^4 - \ldots - x^{2^n})$$

where $\Delta t$ is a standard clock cycle, and M is the number of clock cycles of the physical clock signal in a single adjustment cycle.

5. The time synchronization method of claim 2, further comprising, before the adjustment stage, determining the physical time deviation E according to the following formula:

$$E = M \cdot \Delta t \cdot \left( x - \frac{x^2}{1 - x^2} \right)$$

where $\Delta t$ is a standard clock cycle, and M is the number of clock cycles of the physical clock signal in a single adjustment cycle.

6. The time synchronization method of claim 1, wherein obtaining logical time at least according to the physical clock signal and a physical time deviation comprises:
determining a first logical clock cycle $T_{l\_1}$ according to the following formula:

$$T_{l\_1} = \Delta t - \frac{E}{N \cdot M}$$

where $\Delta t$ is a standard clock cycle, and E is the physical time deviation; and
obtaining the logical time by conversion according to the physical clock signal and the first logical clock cycle.

7. The time synchronization method of claim 1, further comprising steps performed in a duration stage after the adjustment stage, the steps comprising:
generating a physical clock signal according to the frequency control word corresponding to the Nth adjustment cycle; and
obtaining the logical time by conversion according to the physical clock signal in the duration stage and a second logical clock cycle, wherein the second logical clock cycle is equal to a standard clock cycle.

8. The time synchronization method of claim 1, wherein generating a physical clock signal at least according to a pre-acquired frequency control word corresponding to the adjustment cycle comprises:
generating the physical clock signal according to a reference clock signal and the frequency control word corresponding to the adjustment cycle.

9. The time synchronization method of claim 1, wherein the difference between the target value of the clock slope of the physical clock signal in the Nth adjustment cycle and 1 is less than a preset value; the preset value is $10^{-8}$ or $10^{-10}$.

10. A time synchronization device, comprising:
a physical clock signal generation unit configured to generate, in each adjustment cycle of an adjustment stage, a physical clock signal according to at least a pre-acquired frequency control word corresponding to the adjustment cycle; the adjustment stage comprising N adjustment cycles, N being an integer greater than 1; wherein a clock slope of the physical clock signal generated in each adjustment cycle reaches its corresponding target value, and differences between the target values of the clock slopes of the physical clock signals in the N adjustment cycles and 1 monotonically decrease from a first adjustment cycle to an Nth adjustment cycle; wherein the clock slope is a slope of a relationship curve between physical time generated based on the physical clock signal and reference time; and
a logical time conversion unit configured to obtain logical time at least according to the physical clock signal that is received and a physical time deviation in each adjustment cycle; the physical time deviation is: a time difference between the reference time and the physical time corresponding to the physical clock signal in the Nth adjustment cycle at the end of the Nth adjustment cycle.

11. The time synchronization device of claim 10, further comprising:
a control word determination unit configured to, before the adjustment stage, determine the target value of the clock slope of the physical clock signal in each adjustment cycle, and determine the frequency control word corresponding to the adjustment cycle according to the target value of the clock slope of the physical clock signal in the adjustment cycle and a difference between the reference time corresponding to the beginning of the adjustment cycle and the reference time corresponding to the end of the adjustment cycle.

12. The time synchronization device of claim 11, wherein the target value $S_1$ of the clock slope of the physical clock signal in the first adjustment cycle is determined according to the following formula:

$$S_1 = S_0(1-x)$$

where x is a pre-acquired clock frequency deviation coefficient of the physical clock signal in an initial stage; $S_0$ is a value of the clock slope of the physical clock signal generated according to an initial frequency control word in the initial stage, $S_0 = 1+x$; and
the target value $S_n$ of the clock slope of the physical clock signal of an nth adjustment cycle is determined according to the following formula:

$$S_n = S_{n-1}(1 + x^{2^{n-1}}) = 1 - x^{2^n}$$

where $S_{n-1}$ is the target value of the clock slope of the physical clock signal in a (n−1)-th adjustment cycle, n is an integer, and $1 < n \leq N$.

13. The time synchronization device of claim 11, further comprising: a first time deviation determination unit configured to determine the physical time deviation E according to the following formula before the adjustment stage:

$$E = M \cdot \Delta t \cdot (x - x^2 - x^4 - \ldots - x^{2^n})$$

where $\Delta t$ is a standard clock cycle, and M is the number of clock cycles of the physical clock signal in a single adjustment cycle.

14. The time synchronization device of claim 11, further comprising: a second time deviation determination unit configured to determine the physical time deviation E according to the following formula before the adjustment stage:

$$E = M \cdot \Delta t \cdot \left( x - \frac{x^2}{1 - x^2} \right)$$

where Δt is a standard clock cycle, and M is the number of standard clock cycles of the physical clock signal in a single adjustment cycle.

15. The time synchronization device of claim 10, wherein the logical time conversion unit is configured to determine a first logical clock cycle $T_{l\_1}$ according to the following formula in each adjustment cycle, and obtain the logical time by conversion according to the physical clock signal and the first logical clock cycle:

$$T_{l\_1} = \Delta t - \frac{E}{N \cdot M}$$

where Δt is a standard clock cycle, and t is the physical time deviation.

16. The time synchronization device of claim 10, wherein the physical clock signal generation unit is further configured to generate a physical clock signal according to the frequency control word corresponding to the Nth adjustment cycle in a duration stage after the adjustment stage; and the logical time conversion unit is further configured to obtain the logical time by conversion according to the physical clock signal in the duration stage and a second logical clock cycle in the duration stage, wherein the second logical clock cycle is equal to athe standard clock cycle.

17. The time synchronization device of claim 10, wherein the physical clock signal generation unit is configured to generate the physical clock signal according to a reference clock signal and the frequency control word corresponding to the adjustment cycle.

18. The time synchronization device of claim 17, wherein the physical clock generation unit comprises a time average frequency direct period synthesizer.

19. A network node device, comprising the time synchronization device of claim 10.

20. The time synchronization device of claim 10, wherein the difference between the target value of the clock slope of the physical clock signal in the Nth adjustment cycle and 1 is less than a preset value; the preset value is $10^{-8}$ or $10^{-10}$.

* * * * *